United States Patent
Maheshwari et al.

(10) Patent No.: US 7,570,503 B1
(45) Date of Patent: Aug. 4, 2009

(54) TERNARY CONTENT ADDRESSABLE MEMORY (TCAM) CELLS WITH LOW SIGNAL LINE NUMBERS

(75) Inventors: Dinesh Maheshwari, Fremont, CA (US); Andrew Wright, Fremont, CA (US); Bin Jiang, Milpitas, CA (US); Bartosz Banachowicz, Santa Clara, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 93 days.

(21) Appl. No.: 11/438,185

(22) Filed: May 22, 2006
(Under 37 CFR 1.47)

Related U.S. Application Data (60) Provisional application No. 60/683,237, filed on May 20, 2005.

(51) Int. Cl.
*G11C 15/00* (2006.01)

(52) U.S. Cl. .................. 365/49.1; 365/154; 365/168

(58) Field of Classification Search .............. 365/168, 365/196, 207, 49.1, 68, 154
See application file for complete search history.

(56) References Cited

U.S. PATENT DOCUMENTS

| | | | |
|---|---|---|---|
| 4,646,271 A | 2/1987 | Uchiyama et al. |
| 4,694,425 A | 9/1987 | Imel |
| 4,723,224 A | 2/1988 | Van Hulett et al. |
| 4,779,226 A | 10/1988 | Haraszti |
| 4,791,606 A | 12/1988 | Threewitt et al. |
| 4,845,668 A | 7/1989 | Sano et al. |
| 4,928,260 A | 5/1990 | Chuang et al. |
| 4,975,873 A | 12/1990 | Nakabayashi et al. |
| 4,646,271 A | 8/1993 | Ushiyama et al. |
| 5,325,501 A | 6/1994 | Carlstedt |
| 5,422,838 A | 6/1995 | Lin |
| 5,568,415 A | 10/1996 | McLellan et al. |
| 5,841,874 A | 11/1998 | Kempke et al. |
| 6,081,440 A | 6/2000 | Washburn et al. |
| 6,108,227 A | 8/2000 | Voelkel |
| 6,191,970 B1 | 2/2001 | Pereira |
| 6,373,739 B1 | 4/2002 | Lien et al. |
| 6,418,042 B1 | 7/2002 | Srinivasan et al. |
| 6,460,112 B1 | 10/2002 | Srinivasan et al. |
| 6,502,163 B1 | 12/2002 | Ramankutty |
| 6,539,455 B1 | 3/2003 | Khanna et al. |
| 6,574,702 B2 | 6/2003 | Khanna et al. |
| 6,707,693 B1 | 3/2004 | Ichiru |

(Continued)

OTHER PUBLICATIONS

U.S. Appl. No. 10/931,960, Bettman et al.

(Continued)

*Primary Examiner*—VanThu Nguyen
*Assistant Examiner*—Han Yang
(74) *Attorney, Agent, or Firm*—Haverstock & Owens, LLP (57) ABSTRACT

A ternary content addressable memory (TCAM) cell circuit formed in a TCAM memory cell array having cells arranged in rows and columns can include a first storage circuit with first and second data path, a second storage circuit with a third and fourth data path, and a compare circuit. No more than four conductive lines in a column wise direction have a direct electrical connection to the TCAM cell. Such conductive lines can include a first bit line coupled to the first data path and the third data path and a second bit line coupled to the second data path and the fourth data path.

6 Claims, 10 Drawing Sheets

U.S. PATENT DOCUMENTS

| | | |
|---|---|---|
| 6,708,250 B2 | 3/2004 | Gillingham |
| 6,728,124 B1 | 4/2004 | Ichiru et al. |
| 6,751,110 B2 | 6/2004 | Hu |
| 6,795,325 B1 | 9/2004 | Inoue |
| 6,804,134 B1 | 10/2004 | Proebsting et al. |
| 6,829,153 B1 | 12/2004 | Park et al. |
| 6,839,256 B1 | 1/2005 | Proebsting et al. |
| 6,842,360 B1 | 1/2005 | Srinivasan |
| 6,845,025 B1 | 1/2005 | Nataraj |
| 6,888,730 B2 * | 5/2005 | Foss et al. .................. 365/49.1 |
| 2004/0109338 A1 * | 6/2004 | Jeung .......................... 365/95 |
| 2004/0141348 A1 * | 7/2004 | Shau ........................... 365/49 |

OTHER PUBLICATIONS

U.S. Appl. No. 11/011,464, Smith, Scott.
U.S. Appl. No. 11/090,116, Banachowicz et al.
U.S. Appl. No. 11/146,639, Maheshwari, Dinesh.
U.S. Appl. No. 11/366,040, Maheshwari, Dinesh.
U.S. Appl. No. 11/376,764, Maheshwari, Dinesh.
U.S. Appl. No. 11/384,736, Maheshwari, Dinesh.

* cited by examiner

TERNARY CONTENT ADDRESSABLE MEMORY (TCAM) CELLS WITH LOW SIGNAL LINE NUMBERS

This application claims the benefit of U.S. Provisional Patent Application Ser. No. 60/683,237, filed May 20, 2005, the contents of which are incorporated by reference herein.

TECHNICAL FIELD

The present invention relates generally to memory devices, and more particularly to ternary content addressable memory (TCAM) cells connected to signal lines disposed in a column wise direction of a TCAM cell array.

BACKGROUND OF THE INVENTION

Conventional content addressable memories (CAMs) can provide rapid matching between a specific pattern of received data bits, commonly known as a search key or comparand, and data values stored in a content addressable memory (CAM) array. In a CAM device, a CAM array can be searched in parallel. If a match occurs between each bit of a stored data value and a corresponding bit of an applied comparand, a match indication can be generated, via a match line, to indicate that the applied comparand is stored in the CAM. Data associated with the matching CAM location can then be returned. Thus, in a CAM device, a result can be determined from finding a matching value (content), and not from an address for a value, as is typically done for a random access memory (RAM).

Conventional CAMs are typically composed of a number of CAM cells that can be arranged into an array having rows and columns. Data values for comparison are usually arranged in the row direction. Conventional CAM cells can include binary CAM cells as well as ternary CAM (TCAM) cells.

A conventional TCAM cell can store three states, including a logic "0", logic "1" and a "don't care". When such a TCAM cell stores a logic "0" or logic "1", the TCAM cell can provide the same essential match operation as a binary CAM cell. However, when such a TCAM cell stores a "don't care" value, the TCAM cell can provide a match result regardless of the compare data value applied to the TCAM cell.

Figure 16:
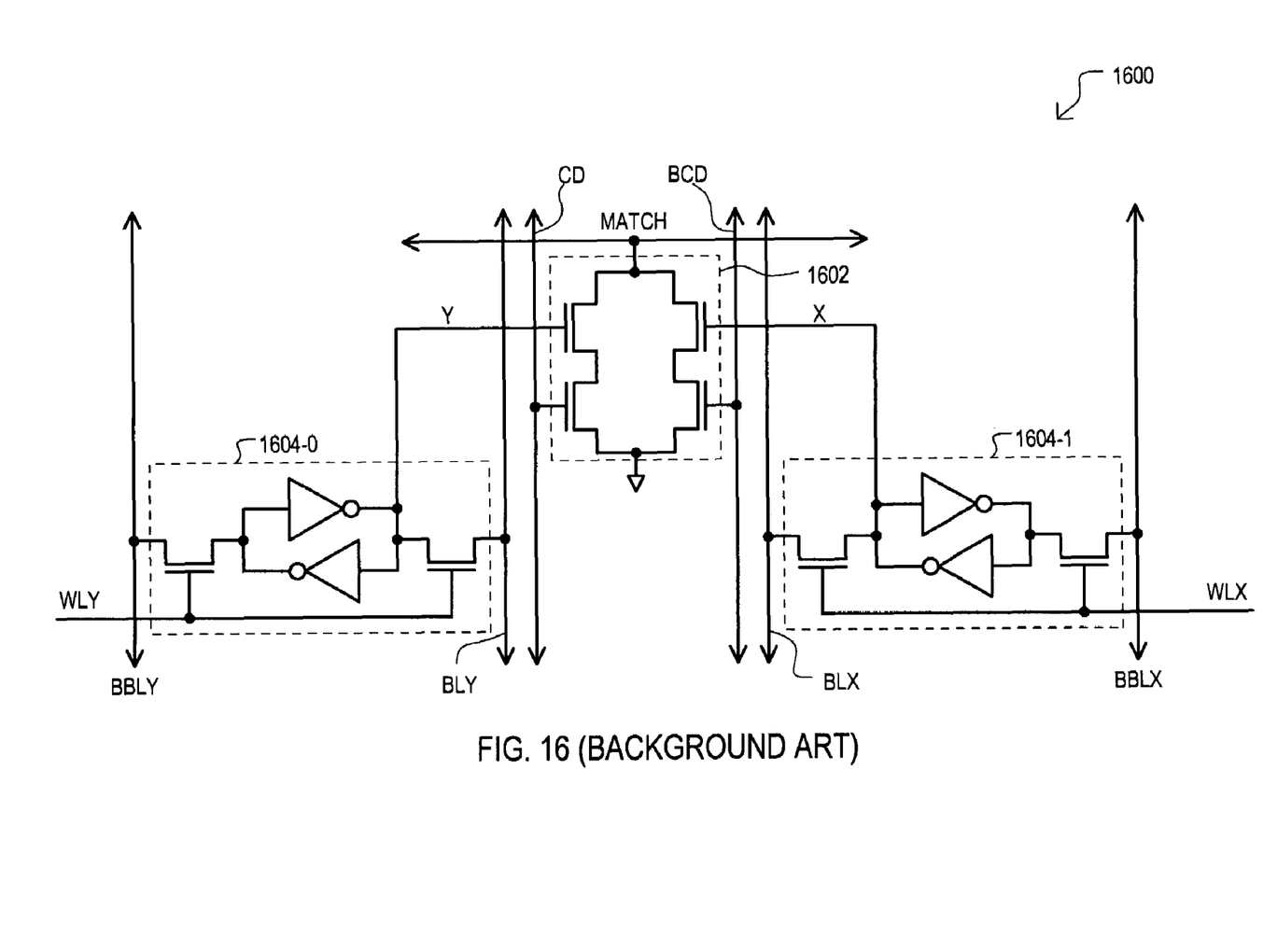
FIG. 16 is a schematic diagram of a conventional XY ternary CAM cell.

A conventional "X/Y" type TCAM cell is shown in FIG. 16. Referring to FIG. 16, a single conventional TCAM cell 1600 generally includes a compare circuit (or "stack") 1602 and two static random access memory (SRAM) cells 1604-0 and 1604-1. In the particular arrangement of FIG. 16, SRAM cells (1604-0 and 1604-1) can store data bits (referred typically as an X-value and Y-value) to be compared by transistors within stack 1602 against externally supplied comparand data provided in complementary form (CD and BCD). The stack 1602 of FIG. 16 includes four N-type metal-oxide-semiconductor (MOS) transistors. Other conventional stacks, such as those utilized in "mask/value" (MN) type TCAM cells can include five or six such transistors.

In the conventional X/Y type TCAM cell 1600 of FIG. 16, a masking value (don't care) is determined according to a data value stored in both SRAM cells (1604-0 and 1604-1). This is in contrast to a "M/V" type TCAM cell in which a masking value is determined according to one data value (e.g., M) stored in a single SRAM cell.

In the conventional TCAM cell 1600 of FIG. 16, write operations to SRAM cells (1604-0 and 1604-1) can be separate ("non-atomic") or simultaneous ("atomic"). In particular, to write data only to "Y" SRAM cell 1604-0, complementary write data can be driven on bit lines BLY and BBLY, and word line WLY can be driven high. Word line WLX can be maintained low to prevent writing of data to "X" SRAM cell 1604-1. Conversely, to write data only to "X" SRAM cell 1604-1, complementary write data can be driven on bit lines BLX and BBLX, and word line WLX driven high, while word line WLY remains low. For a simultaneous write operation, complementary write data can be provided on both bit line pairs BLX/BBLX and BLY/BBLY and both word lines WLX and WLY can be driven high.

In addition, the conventional TCAM cell 1600 can provide for differential read operations and differential write operations. That is, a data value can be read according to two different signals that produce a differential voltage (i.e., X data and complementary XB data or Y data and complementary YB data). Further, in write operations, write data can be applied via two different signals having complementary data values, as noted above. Differential read and write operations can be more reliable than "single" ended read or write operations.

It is noted that the conventional configuration of FIG. 16 includes six conductive lines per cell disposed in a column wise direction for providing data and compare data to the cell: Y bit line pair BBLY/BLY, X bit line pair BBLX/BLX, and compare data line pair CD/BCD.

DETAILED DESCRIPTION

The various embodiments disclose content addressable memory (CAM) cells, and more particularly to ternary CAM (TCAM) cell circuits that can include fewer conductive lines in a column wise direction than a conventional circuit like that of FIG. 16. At the same time, the embodiments can allow for writes to one or more data storage cells within such TCAM cells (i.e., atomic or non-atomic writes).

Figure 1:
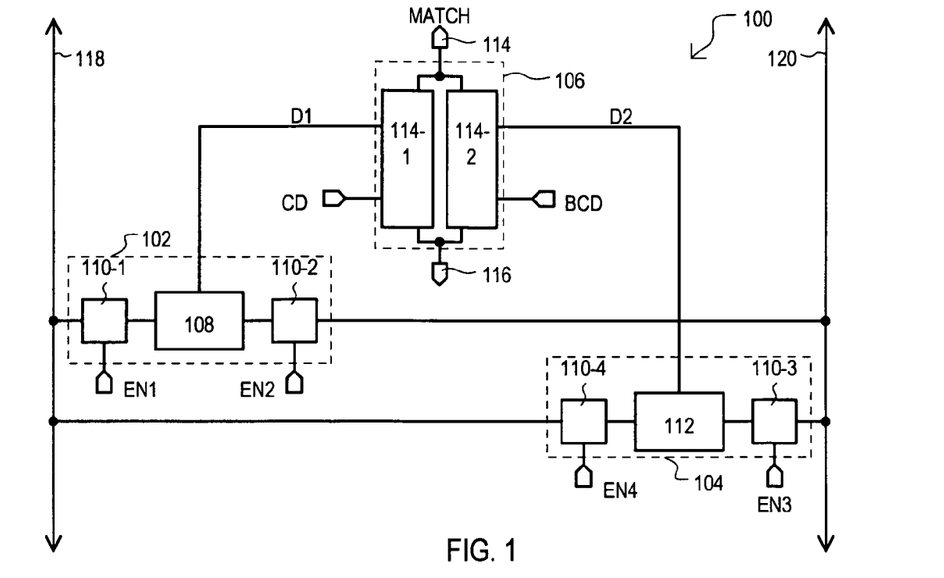
FIG. 1 is a block schematic diagram of a ternary content addressable memory (TCAM) cell according to a first embodiment.

A TCAM cell according to a first embodiment is shown in FIG. 1 in a block schematic diagram, and designated by the general reference character 100. TCAM cell 100 can include a first storage circuit 102, a second storage circuit 104, and a compare circuit 106. First storage circuit 102 can include a first storage section 108, a first data path 110-1 and a second data path 110-2. First and second data paths (110-1 and 110-2) can allow data to be read from and/or written to storage section 108, and are enabled by enable signals EN1 and EN2, respectively. In a similar fashion, second storage circuit 104 can include a second storage section 112, a third data path 110-3 and a fourth data path 1104. Third and fourth data paths (110-3 and 1104) can allow data to be read from and/or written to storage section 112, and can be enabled by enable signals EN3 and EN4, respectively.

A compare circuit 106 can generate a match indication at a match node 114 or reference node 116 in response to a comparison between a data value (D1) provided by first storage circuit 102, a data value (D2) provided by second storage circuit 104, and a compare data value provided in complementary form (CD and BCD). In the example shown, compare circuit 106 can include a first charge transfer path 114-1 and a second charge transfer path 114-2 arranged in parallel between match node 114 and a reference node 116. First charge transfer path 114-1 can enable charge to be transferred between match node 114 and reference node 116 in response to data signal D1 and compare data value CD. Second charge transfer path 114-2 can enable charge to be transferred between match node 114 and reference node 116 in response to data signal D2 and complementary compare data value BCD.

In the particular arrangement shown, TCAM cell 100 can have a direct electrical connection to a first bit line 118 and a second bit line 120. That is, such signals can be provided to the TCAM cell circuits via contact, vias, etc. along with other intervening circuitry of the TCAM cell 100. However, such direct connections can exclude "global" bit lines of greater hierarchy that provide data values to the first and second bit lines.

In the example of FIG. 1, a first bit line 118 can be connected to first data path 110-1 and fourth data path 110-4, while second bit line 120 can be connected to second data path 110-2 and third data path 110-3.

In such an arrangement, data can be read from or written to first storage circuit 102 in a differential fashion via first and second data paths 110-1 and 110-2. Similarly, data can be read from or written to second storage circuit 102 in a differential fashion via third and fourth data paths 110-3 and 1104.

In this way, read and write data paths can be provided to a TCAM cell via only two bit lines, allowing for a compact cell arrangement.

Figure 2:
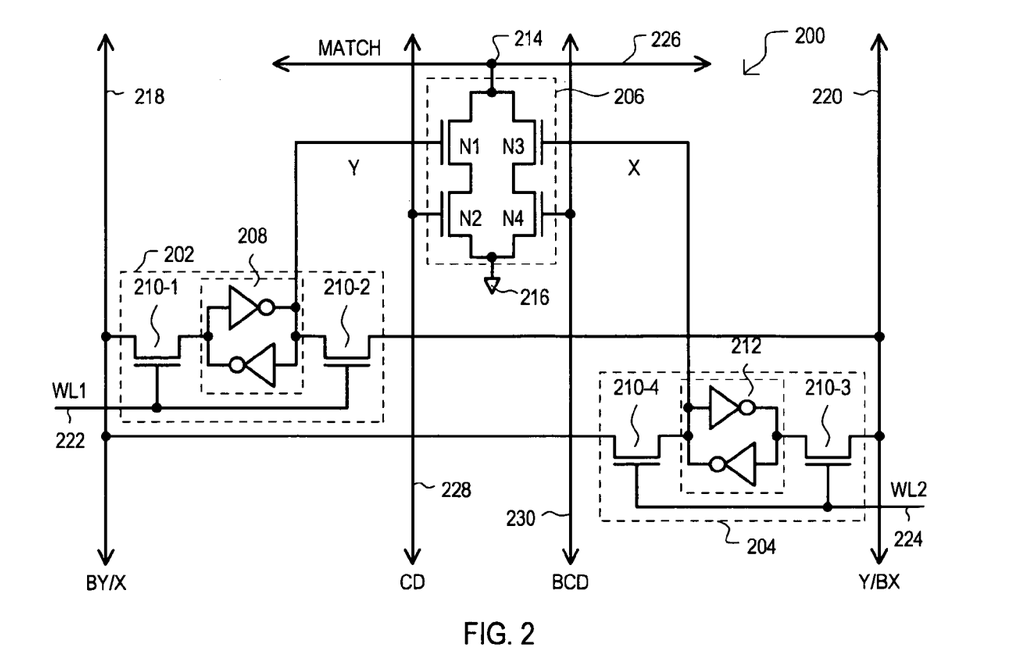
FIG. 2 is a schematic diagram of a TCAM cell according to a second embodiment.

A TCAM cell according to a second embodiment is shown in a schematic diagram in FIG. 2, and designated by the general reference character 200. TCAM cell 200 can include some of the same general circuit sections as FIG. 1, thus like sections are referred to by the same reference character but with the first digit being a "2" instead of a "1".

The TCAM cell 200 of FIG. 2 can be an "XY" type TCAM cell with a Y being stored in a first storage circuit 202 and an X value being stored in a second storage circuit 204. A TCAM cell 200 can provide for differential writes of an X value or Y value, as well as differential reads of an X value or Y value. In addition, write operations can be non-atomic, bitmaskable, and parallel without having an adverse effect on sense amplifier speed.

In the very particular example of FIG. 2, first and second storage cells (202 and 204) can be static random access memory (SRAM) type cells. More particularly, each storage section (208 and 212) can include cross coupled inverters, and each data path (210-1, 210-2, 210-3 and 2104) can be an insulated gate field effect transistor (hereinafter referred to as a MOS transistor, although not implying any particular gate insulating material). Even more particularly, the data paths can be n-channel MOS (NMOS) transistors. Such SRAM cells (202 and 204) can be single word line SRAM cells, each being accessed via a corresponding single word line (222 and 224).

FIG. 2 also shows a compare circuit 206 having a first charge transfer path formed by two NMOS transistors N1 and N2 having source-drain paths arranged in series with one another between match node 214 and reference node 216. A gate of transistor N1 can receive data value Y. A gate a transistor N2 can receive a compare data value CD. A second charge transfer path can be formed by two NMOS transistors N3 and N4 having source-drain paths also arranged in series with one another between match node 214 and a reference node 216. A gate of transistor N3 can receive data value X. A gate a transistor N4 can receive a compare data value BCD.

A match node 214 can be electrically connected to a match line 226. A reference node 216 can be a low power supply node (Vss) or a "pseudo-Vss" node. A pseudo-Vss node is a node that can be precharged to some potential prior to a compare operation, and then allowed to float during a compare operation, or vice versa.

FIG. 2 shows an arrangement in which data bit lines (218 and 220) are not shared with compare data lines. Accordingly, a TCAM cell 200 can directly receive a compare data value CD via a first compare data line 228 and directly receive a complementary compare data value BCD via a second compare data line 230. As will be shown in the embodiment of FIG. 3, TCAM cell arrangements can include shared bit lines that carry both write/read data, as well as compare data, and thus can include only two data signal lines in the column wise direction. Such a sharing can increase the loading on the lines resulting in increased power for a given operation speed or require reductions in speed for a given power budget. Thus, for high speed applications, separate compare data lines and bit lines can be utilized. However, for slower speed applications such lines can be provided in a shared fashion, as will be described below.

In this way, non-power supply signals can be provided with only four conductive lines arranged in a column wise direction (vertically in FIG. 2).

It is noted that in the arrangement of FIG. 2, one step atomic writes (writes of both X and Y values) are not supported. However, such a write operation can be accomplished in two steps.

Having described the general construction of the embodiment of FIG. 2, the operation of the TCAM cell 200 will now be described.

In a precharge step preceding a compare operation, a match line 226 can be precharged to a relatively high potential, while compare data lines 228/230 are low. A reference node 216 can be precharged (or maintained) at a potential below that of match line 226.

In a compare (match evaluation) step, compare data lines 228/230 can be driven to complementary compare data values CD/BCD. In the event of a match (HIT) result, first and second charge transfer paths (N1/N2 and N3/N4) can be disabled, thus, there is no current path between match line 226 and reference node 216. Consequently, a match line 226 and/or reference node 216 can remain at the precharged potential (assuming all other TCAM cells coupled to such a line have the same match result). In contrast, in the event of a mismatch (MISS) result, at least one of charge transfer paths can be enabled, and a current path can be created between match node 214 and reference node 116. As a result, the potential at one or both such nodes can vary, indicating a MISS result.

It is understood that a match result can be generated when an applied compare data value matches a data value indicated by the X and Y values, or if the X and Y values have a masked (don't care) state.

A TCAM cell 200 can advantageously include only four conductive lines in the column wise direction (vertical in FIG. 2). This can provide for less resistance/capacitance for compare data lines, by spacing the vertical lines farther apart to reduce coupling capacitance for same area. In addition or alternatively, because more area is available (as compared to a six line arrangement) the size of such lines can be increased thereby reduce their resistance. This can allow for higher speeds and/or lower power operations Furthermore, as noted above, TCAM cell 200 can support independent (non-atomic) X or Y writes, as well as differential reads and writes. In the event of writes for both X and Y values, two operations are needed (2 cycle write).

Figure 3:
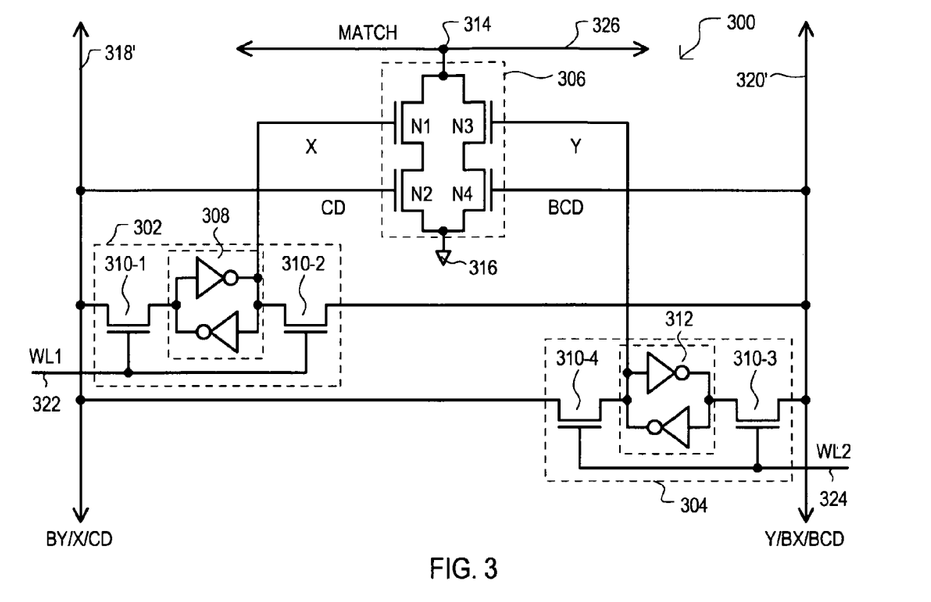
FIG. 3 is a schematic diagram of a TCAM cell according to a third embodiment.

As previously described, in alternate applications, for example when power and/or speed is not as critical, data bit lines and compare data lines can be shared for an even more compact arrangement. One such embodiment is shown in FIG. 3, and designated by the general reference character 300.

A TCAM cell 300 can include some of the same general circuit sections as FIG. 2, thus like sections are referred to by the same reference character but with the first digit being a "3" instead of a "2".

TCAM cell 300 can differ from that of FIG. 2 in that separate compare data lines are not included. Instead, TCAM cell 300 can include a first shared bit line 318' and a second shared bit line 320'. First shared bit line 318' can be connected not only to first and fourth data paths (310-1 and 3104), but also to compare circuit 306 to provide compare data value CD. Second shared bit line 320' can be connected not only to second and third data paths (310-2 and 310-3), but also to compare circuit 306 to provide complementary compare data value BCD.

Accordingly, depending upon mode (i.e., write or compare), shared bit lines (318' and 320') can be driven with a compare data value or write data value. Even more particularly, in a write operation of a Y value, shared bit line 318' can carry a complementary Y value (BY), and shared bit line 320' can carry a Y value. In a write operation of an X value, shared bit line 318' can carry an X value, and shared bit line 320' can carry a complementary X value (BX). In a compare operation, shared bit line 318' can carry a compare data value CD, and shared bit line 320' can carry a complementary compare data value BCD.

In this way, a TCAM cell can include but two signal lines in a column wise direction for providing non-power supply signals.

Figure 4A:
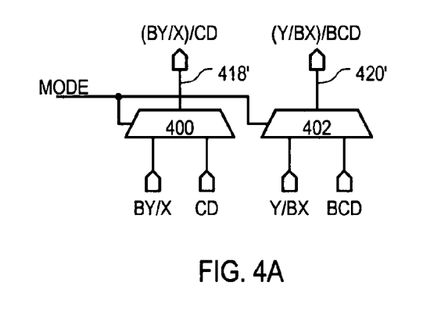
FIGS. 4A and 4B show circuits for generating signals on shared bit lines that can be included in the embodiments.
Figure 4B:
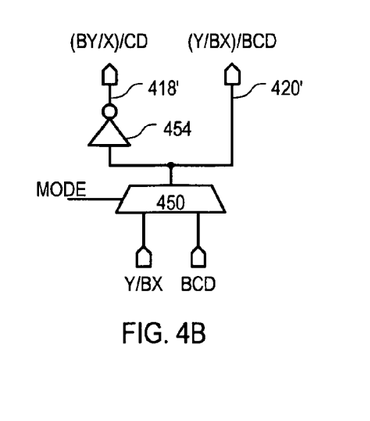

FIG. 4A shows one very particular example of a circuit for generating values on shared bit lines like those of FIG. 3. According to a mode signal MODE, which indicates a write or compare operation, different values can be provided to shared bit lines 418' and 420' by operation of multiplexers (MUXs) 400 and 402. FIG. 4B shows yet another of the many possible ways of generating values on shared bit lines. According to a mode signal MODE, either a write data value (i.e., Y or BX) or compare data value BCD can be output from a MUX 450. Such an output value can then be provided on shared bit line 420' in a non-inverted form, and on shared bit line 418' in an inverted form.

Figure 5:
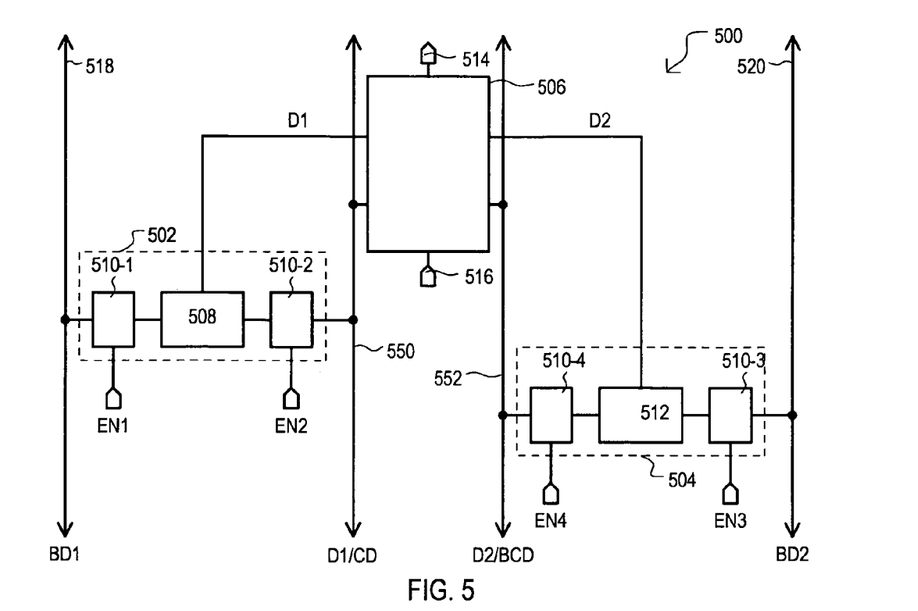
FIG. 5 is a block schematic diagram of a TCAM cell according to a fourth embodiment.

A TCAM cell according to a fourth embodiment is shown in FIG. 5, and designated by the general reference character 500. TCAM cell 500 can include some of the same general circuit sections as FIG. 1, thus like sections are referred to by the same reference character but with the first digit being a "5" instead of a "1".

Unlike the arrangement of FIG. 1, within TCAM cell 500 a compare circuit 506 does not necessarily have the same particular structure as compare circuit 106.

The arrangement of FIG. 5 can also differ from that of FIG. 1 in that it can include a first shared bit lines 550 and a second shared bit line 552. First shared bit line 550 can be connected to second data path 510-2, and can provide a compare data value CD to compare circuit 506. Second shared bit line 552 can be connected to fourth data path 510-4 and provide a complementary compare data value BCD to compare circuit 506.

Such an arrangement can provide reduced capacitive loading, as compared to that of FIG. 3, in that each shared bit line (550 and 552) can be connected to a transistor gate and one diffusion of each TCAM cell, as opposed to a transistor gate and two diffusions.

Still further, the arrangement of FIG. 5 can provide for simultaneous writes to both storage circuits 502 and 504 (atomic writes). In particular, a data value in complementary form (BD1/D1) can be driven on first bit line 518 and first shared bit line 550, while another data value in complementary form (BD2/D2) can be driven on bit line 520 and shared bit line 552. Enable signals EN1 to EN4 can be activated, allowing for data to be written into both storage sections 508 and 512 essentially simultaneously.

Figure 6:
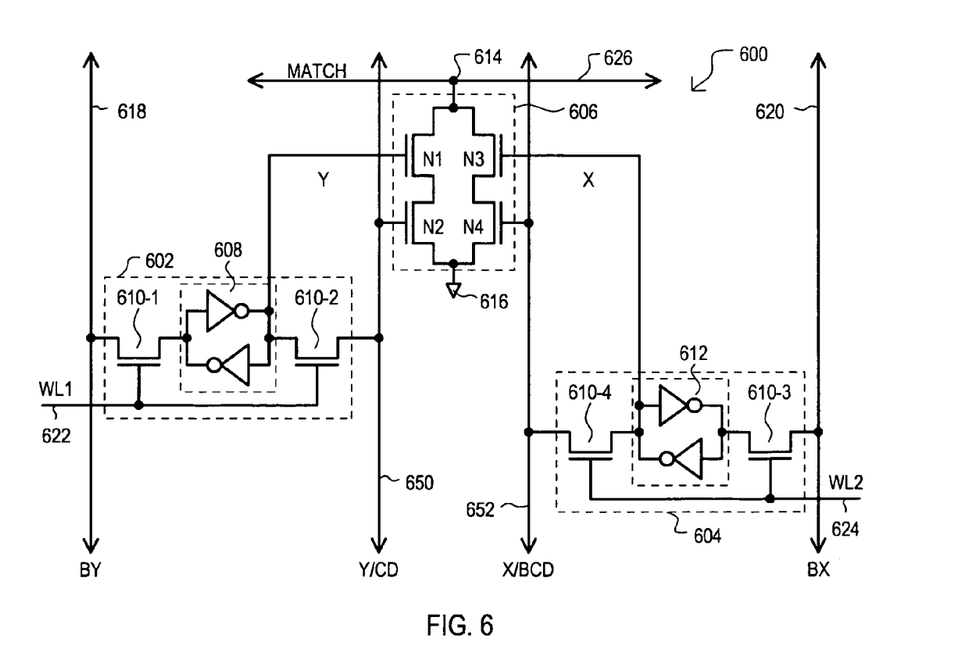
FIG. 6 is a schematic diagram of a TCAM cell according to a fifth embodiment.

A TCAM cell according to a fifth embodiment is shown in a schematic diagram in FIG. 6, and designated by the general reference character 600. TCAM cell 600 can include some of the same general circuit sections as FIG. 5, thus like sections are referred to by the same reference character but with the first digit being a "6" instead of a "5".

TCAM cell 600 can be an "XY" type TCAM cell with a Y value being stored in a first storage circuit 602 and an X value being stored in a second storage circuit 604. A TCAM cell 600 can provide for differential writes of an X value or Y value, as well as differential reads of an X value or Y value. In addition, write operations can be non-atomic, atomic, bit maskable, and parallel without having an adverse effect on sense amplifier speed.

In the very particular example of FIG. 6, first and second storage cells (602 and 604) can be SRAM type cells like those shown in FIG. 2. In addition, a compare circuit 606 can have the same general construction as compare circuit 206 shown in FIG. 2. A match node 614 can be electrically connected to a match line 626, and a reference node 616 can be a low power supply node (Vss) or a "pseudo-Vss" node.

Depending upon mode (i.e., write or compare), shared bit lines (650 and/or 652) can be driven with a compare data value or a write data value. Even more particularly, in a write operation of a Y value, shared bit line 650 can carry a Y value. In a write operation of an X value, shared bit line 652 can carry an X value. In a compare operation, first shared bit line 650 can carry a compare data value CD, and second shared bit line 652 can carry a complementary compare data value BCD.

In this way, a fifth embodiment can perform a differential writes of X and/or Y values, differential reads of X and/or Y values and support non-atomic or atomic writes of X and Y values. In addition, bit maskable writes can be supported, as well as independent X,Y parallel writes to multiple rows.

Figure 7:
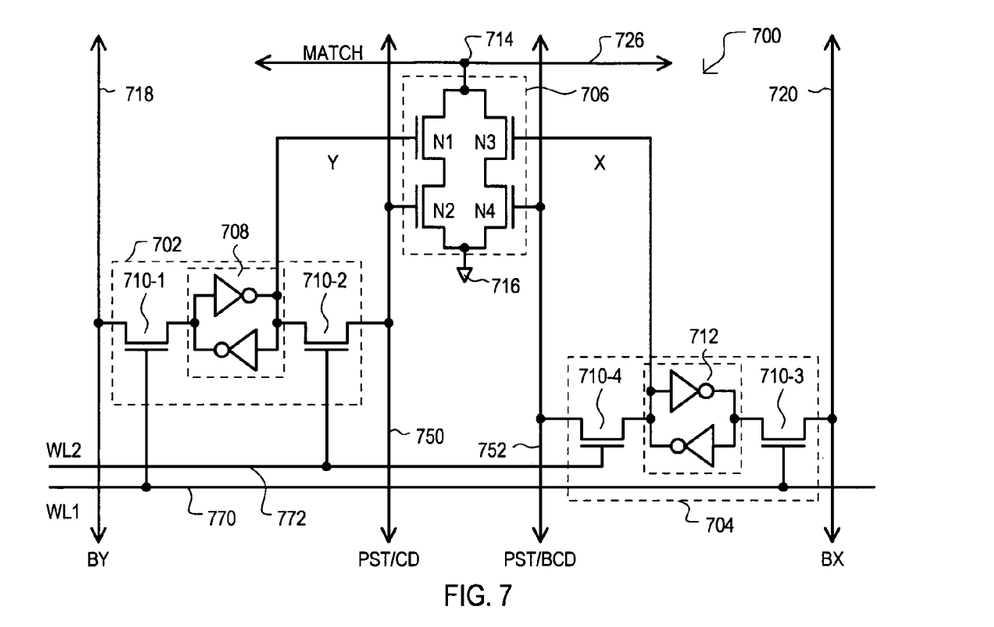
FIG. 7 is a schematic diagram of a TCAM cell according to a sixth embodiment.

A TCAM cell according to a sixth embodiment is shown in a schematic diagram in FIG. 7, and designated by the general reference character 700. TCAM cell 700 can include some of the same general circuit sections as FIG. 6, thus like sections are referred to by the same reference character but with the first digit being a "7" instead of a "6".

The embodiment of FIG. 7 can differ from that of FIG. 6 in that storage circuits (702 and 704) can be dual word line SRAM cells. Thus, first and third data paths 710-1 and 710-3 can be connected to a first word line 770, while second and fourth data paths 710-2 and 7104 can be connected to a second word line 772.

In such an arrangement, write operations can be atomic, with the activation of both word lines, or with a preset step. In the former case, a Y data value can be provided in complementary form on bit line 718 and shared bit line 750, while an X data value can be provided in complementary form on bit line 720 and shared bit line 752. When both word lines (770 and 772) are activated, such data values can be written. In the latter case, prior to write data being driven, shared bit lines (750 and 752) can both be driven low, while second word line 772 is activated and then deactivated. This can force first and second storage circuits (702 and 704) to store a predetermined value (X=Y=0). Subsequently, a complementary Y data value (YB) can be driven on bit line 718, while a complementary X data value (XB) can be driven on bit line 720. First word line 770 can then be activated, resulting in the X and Y data values being written into first and second storage circuits (702 and 704). Writes to only X or Y values can operate in the same general fashion, with a preset voltage applied to only one shared bit line (750 or 752), activation of the second word line 772, and then write data at the appropriate bit line, and activation of the first word line 770.

Differential read operations can occur by activating both word lines.

In this way, a sixth embodiment 700 can perform a differential write of X and/or Y values, differential reads of X and/or Y values. The embodiment of FIG. 7 can include only four column wise (vertical in FIG. 7) conductive lines, can support atomic as well as non-atomic X and Y writes, bit maskable writes, and independent X,Y parallel writes to multiple rows.

Figure 8A:
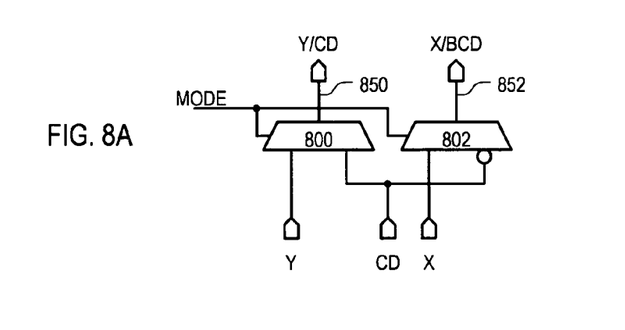
FIGS. 8A and 8B show circuits for generating signals on shared bit lines that can be included in the embodiments.
Figure 8B:
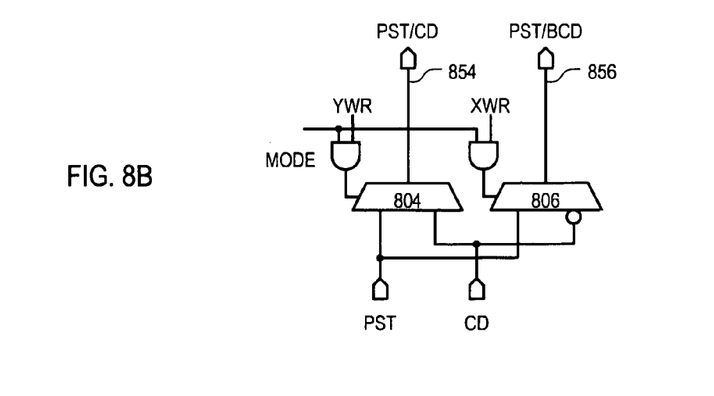

FIG. 8A shows one very particular example of a circuit for generating values on shared bit lines like those of FIG. 6 or 7. According to a mode signal MODE, which indicates a write or compare operation, different values can be provided to shared bit lines 850 and 852 by operation of MUXs 800 and 802. FIG. 8B shows one very particular example of a circuit for generating values on shared bit lines like those of FIG. 7, when a preset operation is employed. According to a mode signal MODE, which indicates a write or compare operation, preset values PST (e.g., low supply voltage) or compare data values can be provided to shared bit lines 854 and 856 by operation of MUXs 804 and 806. Individual preset for writes to X, Y or both sides can be controlled by signals XWR and YWR.

Figure 9:
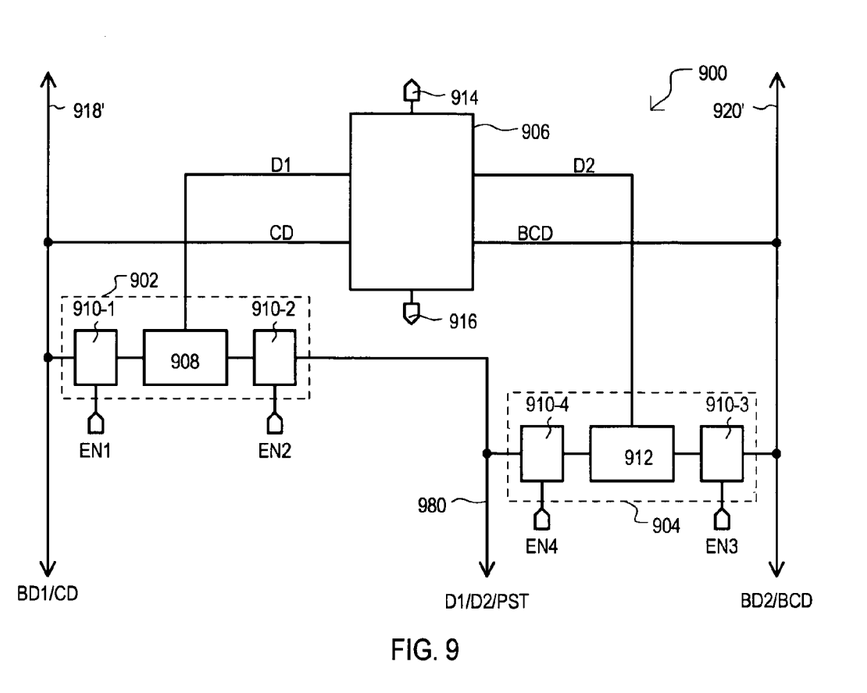
FIG. 9 is a block schematic diagram of a TCAM cell according to a seventh embodiment.

A TCAM cell according to a seventh embodiment is shown in FIG. 9, and designated by the general reference character 900. TCAM cell 900 can include some of the same general circuit sections as FIG. 1, thus like sections are referred to by the same reference character but with the first digit being a "9" instead of a "1".

Unlike the arrangement of FIG. 1, within TCAM cell 900 a compare circuit 906 does not necessarily have the same particular structure as compare circuit 106.

The arrangement of FIG. 9 can also differ from that of FIG. 1 in that it can include first shared bit line 918', second shared bit line 920', and a third shared bit line 980. First shared bit line 918' can be connected to first data path 910-1, and can provide either a complementary first data value (BD1) or a compare data value CD. Second shared bit line 920' can be connected to a third data path 910-3, and can provide either a complementary second data value (BD2) or a complementary compare data value BCD. Third shared bit line 980 can be connected to second data path 910-2 and fourth data path 910-4, and can provide either a first data value D1 or second data value D2.

Such an arrangement can provide a reduced number of lines in a column wise direction (vertical in FIG. 9), but providing compare data or write/read data on the same bit lines, and providing one of two data values on another shared bit line.

Still further, the arrangement of FIG. 9 can provide for individual writes to either storage circuits 902 or 904. Write operations can be differential, or can rely on a preset step like that described for FIG. 7. In the differential case, in a write to storage circuit 902, a data value D1 can be provided in complementary form (BD1/D1) on shared bit line 918' and shared bit line 980, respectively. Activation of signals EN1 and EN2 can result in such data being written to storage circuit 902. In a write to storage circuit 904, a data value D2 can be provided in complementary form (BD2/D2) on shared bit line 920' and shared bit line 980, respectively. Activation of signals EN3 and EN4 can result in such data being written to storage circuit 904.

In a preset type write operation, prior to write data being driven, shared bit line 980 can be driven low, while data paths EN2 and EN4 are enabled. This can force first and second storage circuits (902 and 904) to store a predetermined value. Subsequently, a data value BD1 can be driven on shared bit line 918' and enable signal EN1 activated, to write the data D1 to storage cell 902. Alternatively, a data value BD2 can be driven on shared bit line 920' and enable signal EN3 can be activated, to write the data value D2 to storage cell 904.

In this way, non-atomic write operations can be accomplished with only three non-power supply lines arranged in a column wise direction.

Figure 10:
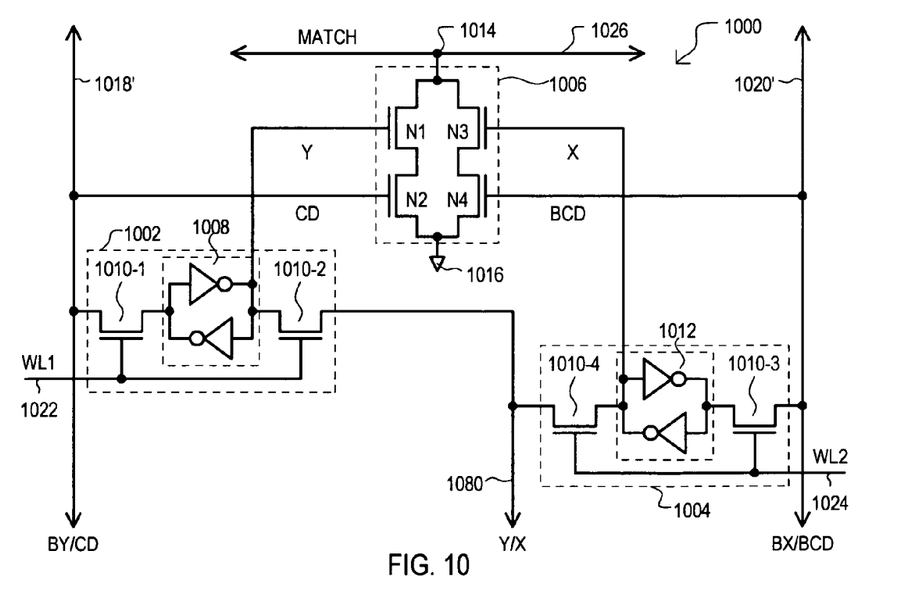
FIG. 10 is a schematic diagram of a TCAM cell according to an eighth embodiment.

A TCAM cell according to an eighth embodiment is shown in a schematic diagram in FIG. 10, and designated by the general reference character 1000. TCAM cell 1000 can include some of the same general circuit sections as FIG. 9, thus like sections are referred to by the same reference character but with the first digit being a "10" instead of a "9".

TCAM cell 1000 can be an "XY" type TCAM cell with a Y value being stored in a first storage circuit 1002 and an X value being stored in a second storage circuit 1004. A TCAM cell 1000 can provide for differential writes of an X value or Y value, as well as differential reads of an X value or Y value. In addition, write operations can be non-atomic.

In the very particular example of FIG. 10, first and second storage cells (1002 and 1004) can be SRAM type cells like those shown in FIG. 2. In addition, a compare circuit 1006 can have the same general construction as 206 shown in FIG. 2, match node 1014 can be electrically connected to a match line 1026, and a reference node 1016 can be a low power supply node (Vss) or a "pseudo-Vss" node.

Depending upon mode (i.e., write X value, write Y value, or compare), shared bit lines (1018', 1020' and 1080) can be driven with compare data value or write data. Even more particularly, in a write operation of a Y value, shared bit line 1018' can carry a complementary Y value (YB), shared bit line 1080 can carry a Y value, and first word line 1022 can be activated while second word line 1024 is deactivated. In a write operation of an X value, shared bit line 1020' can carry a complementary X value (XB), shared bit line 1080 can carry an X value, and second word line 1024 can be activated while first word line 1022 is deactivated. In a compare operation, shared bit line 1018' can carry a compare data value CD, and shared bit line 1020' can carry a complementary compare data value BCD, while both first and second word lines (1022 and 1024) are deactivated. Differential read operations of a Y value can be accomplished by activating first word line 1022. Differential read operations of an X value can be accomplished by activating second word line 1024.

In this way, an eighth embodiment can accommodate differential writes of X or Y values, differential reads of X or Y values, and support non-atomic writes of X or Y values.

Figure 11:
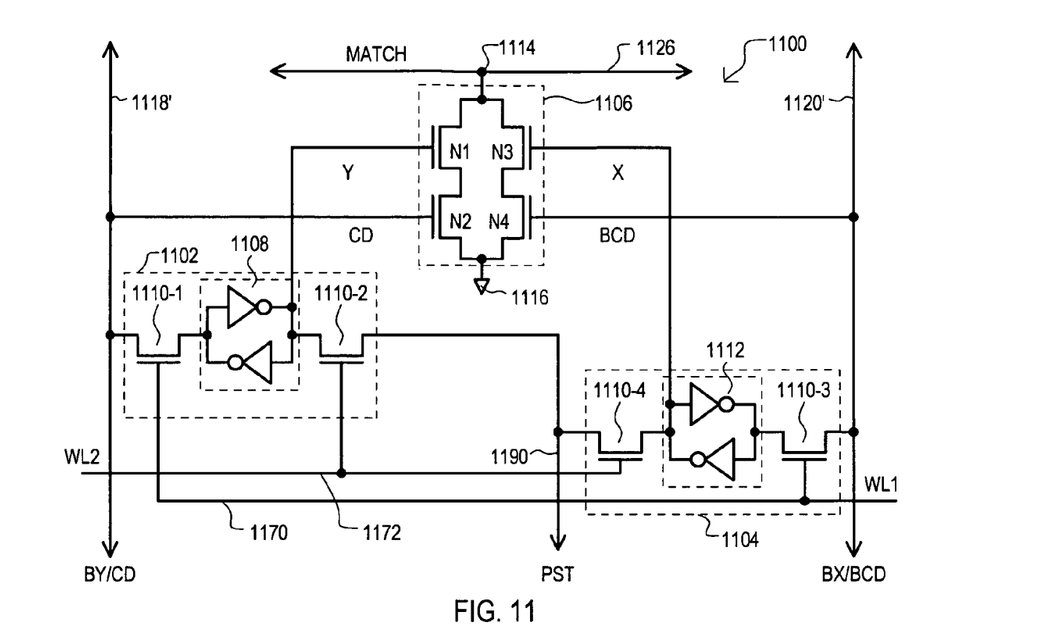
FIG. 11 is a schematic diagram of a TCAM cell according to a ninth embodiment.

A TCAM cell according to a ninth embodiment is shown in a schematic diagram in FIG. 11, and designated by the general reference character 1100. TCAM cell 1100 can include some of the same general circuit sections as FIG. 10, thus like sections are referred to by the same reference character but with the first digit being an "11" instead of a "10".

The embodiment of FIG. 11 can include dual word line SRAM cells as storage circuits, like the arrangement of FIG. 7. In such an arrangement, write operations can include a preset step. In particular, first and second word lines 1170 and 1172 can be deactivated, to disable data paths 1110-1 to 1110-4. Third shared bit line 1190 can then be driven to a preset level, which can be a relatively low logic level (e.g., low power supply voltage Vss). Second word line 1172 can then be activated, to preset values in both storage circuits 1102 and 1104. Subsequently, second word line 1172 can be deactivated. A complementary Y value (BY) can be driven on shared bit line 1118' and a complementary X value (BX) can be driven on shared bit line 1120', and first word line 1170 can be activated to write both X and Y values into first and second storage circuits 1102 and 1104, respectively.

Figure 12:
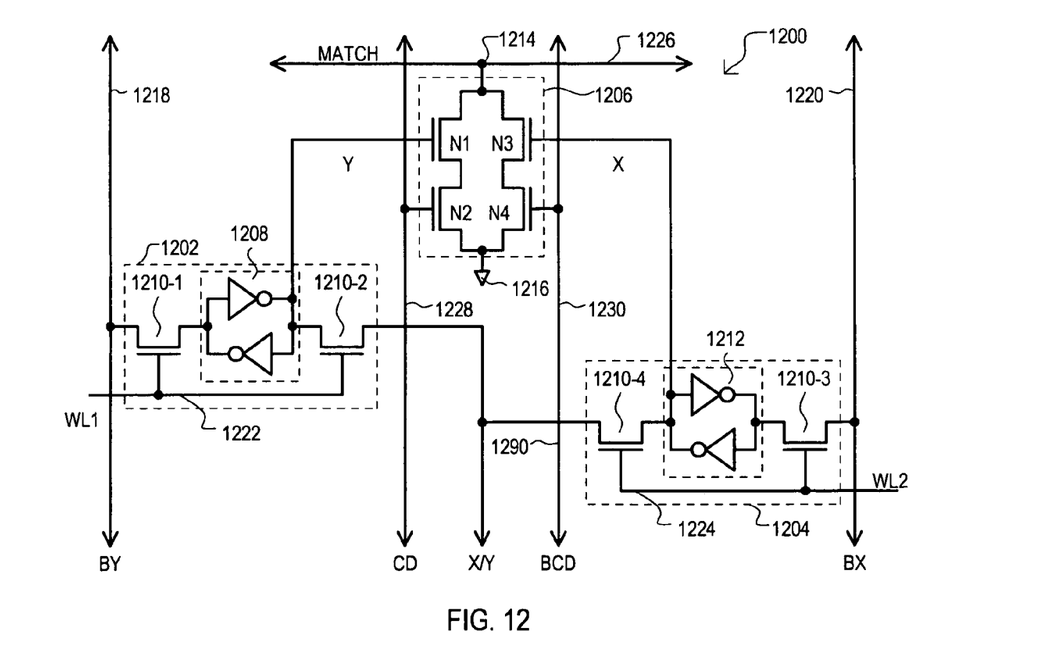
FIG. 12 is a schematic diagram of a TCAM cell according to a tenth embodiment.

A TCAM cell according to a tenth embodiment is shown in a schematic diagram in FIG. 12, and designated by the general reference character 1200. TCAM cell 1200 can include some of the same general circuit sections as FIG. 10, thus like sections are referred to by the same reference character but with the first digit being a "12" instead of a "10".

The embodiment of FIG. 12 can include separate compare data lines 1228 and 1230. Thus, bit lines 1218 and 1220 are not shared bit lines, and can carry values BY and BX, respectively. Such an arrangement can provide for less capacitive loading on bit lines (1218 and 1220) as compared to the embodiment of FIG. 10. However, such an arrangement can include five non-supply signal lines, as opposed to three, as in the case of FIG. 10.

Figure 13:
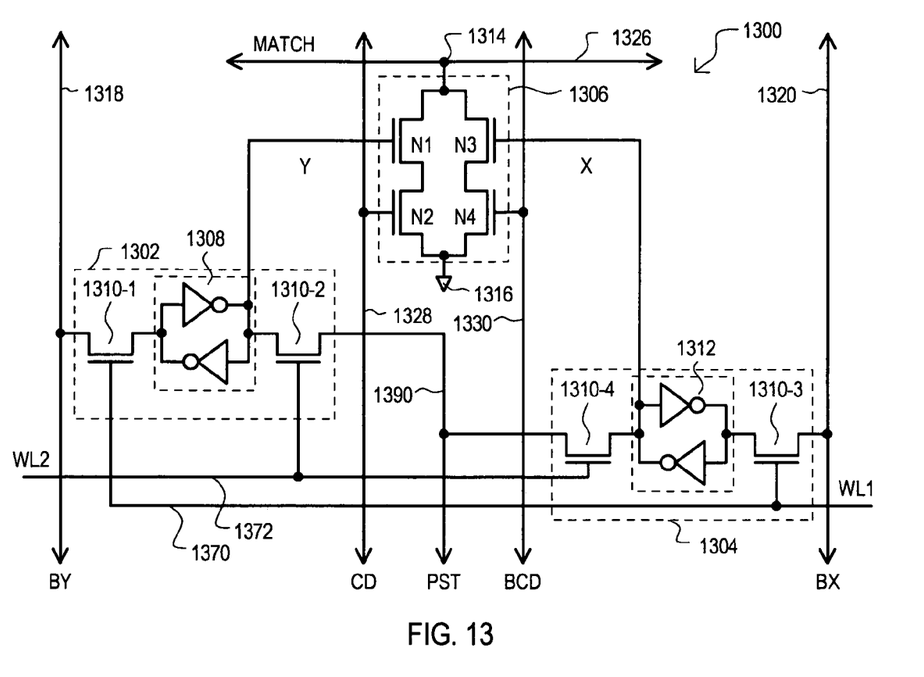
FIG. 13 is a schematic diagram of a TCAM cell according to an eleventh embodiment.

A TCAM cell according to an eleventh embodiment is shown in a schematic diagram in FIG. 13, and designated by the general reference character 1300. TCAM cell 1300 can include some of the same general circuit sections as FIG. 11, thus like sections are referred to by the same reference character but with the first digit being a "13" instead of an "11".

The embodiment of FIG. 13 can include separate compare data lines 1328 and 1330. Thus, bit lines 1318 and 1320 are not shared bit lines, and can carry values BY and BX, respectively. Such an arrangement can provide for less capacitive loading on bit lines (1318 and 1320) as compared to lines 1118' and 1120' of FIG. 11. However, such an arrangement can include five non-supply signal lines, as opposed to three as in the case of FIG. 11.

Figure 14:
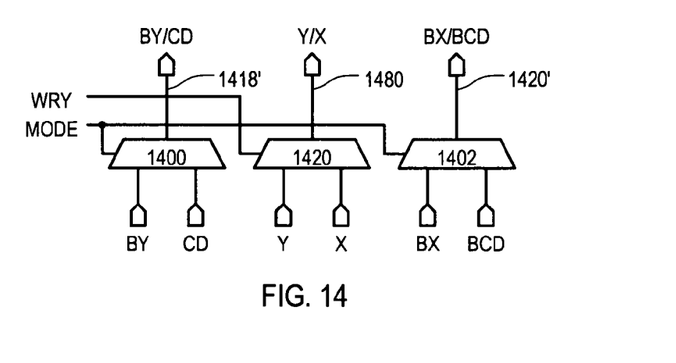
FIG. 14 shows a circuit for generating signals on shared bit lines according to an embodiment.

FIG. 14 shows one very particular example for generating values on shared bit lines like those of FIG. 10. According to a mode signal MODE, which indicates a write or compare operation, different values can be provided to shared bit lines 1418' and 1420' by operation of MUXs 1400 and 1402. In addition, according to a write signal WRY, either a Y data value or an X data value can be provided on shared bit line 1480 by operation of MUX 1420.

It is noted that a MUX 1420 could also be used in conjunction with the embodiment of FIG. 12.

Similarly, it is noted that MUXs (1400 and 1402) could also be used in conjunction with the embodiment of FIG. 11.

Figure 15A:
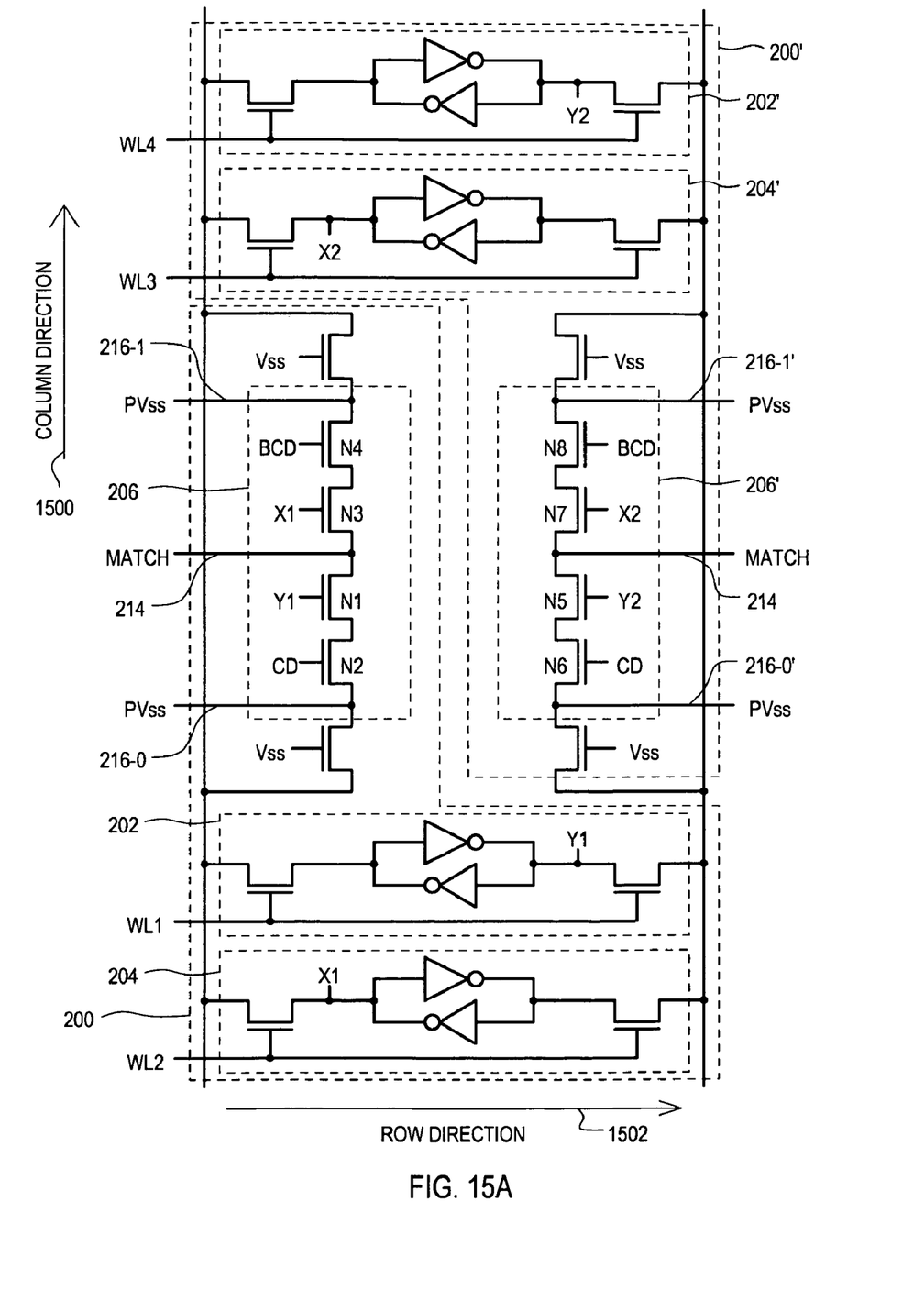
FIGS. 15A and 15B are top plan views showing a layout of TCAM cells according to an embodiment.
Figure 15B:
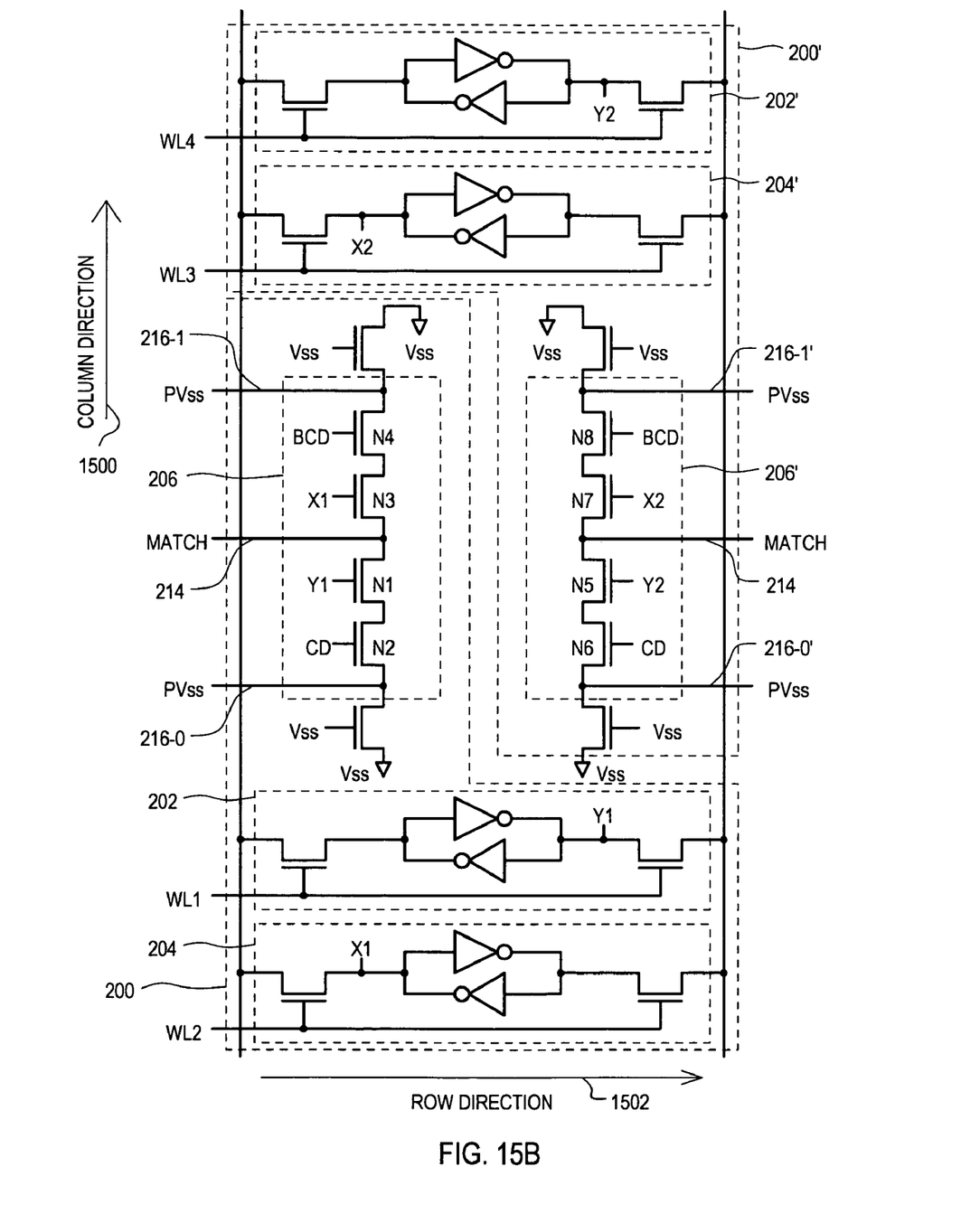

Referring now to FIGS. 15A and 15B, TCAM cell layouts are shown in a top plan view. Both FIGS. 15A and 15B show two TCAM cells 200 and 200' having the same structure as that of FIG. 2. The layout view shows a general physical position of circuit elements within a semiconductor substrate. TCAM cells 200 and 200' are situated next to one another in a column direction, shown by arrow 1500, and can share a match line 214. It is understood that the arrangement of FIG. 15A or 15B can be repeated to form a larger array of TCAM cells.

FIGS. 15A and 15B show an arrangement in which a compare circuit 206 can have transistors N1 to N4 arranged physically in a column disposed in the column direction. First and second storage circuits (204 and 206), which provide an X value and Y value to compare circuit 206, can be disposed at one end (bottom in the views shown). In addition, a compare circuit 206 of a second TCAM cell 200' can be adjacent to compare circuit 206 of the first TCAM cell 200 in the row direction, shown by arrow 1502. Further, storage circuits (202' and 204') of second TCAM cell 200' can be situated at an opposing end of compare circuit 206 of first TCAM cell 200.

For purposes of clarity, many of the details of (subject matter) and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A ternary content addressable memory (TCAM) cell circuit formed in a TCAM memory cell array having cells arranged in rows and columns, comprising:
   a first storage circuit that stores a first data value and has a first data path coupled to a first storage node and a second data path coupled to a second storage node, the first data path and second data path are commonly coupled to a first word line;
   a second storage circuit that stores a second data value and has a third data path coupled to a third storage node and a fourth data path coupled to a fourth storage node, the third data path and fourth data path are commonly coupled to a second word line;
   a compare circuit that generates a match result at a match node based on the first data value, second data value, and a compare data value; and
   no more than five conductive lines disposed in the column wise direction having a direct electrical connection to the TCAM cell for providing non-power supply signals, including a first bit line coupled to the first data path, a second bit line coupled to the third data path, and a third bit line coupled to the second and fourth data paths.

2. The TCAM cell circuit of claim 1, wherein:
   the no more than five conductive lines further includes a first compare data line coupled to receive the compare data value and a second compare data line coupled to receive a complementary compare data value.

3. The TCAM cell circuit of claim 1, wherein:
   the compare circuit includes
   a first charge transfer path comprising a first compare transistor having a control terminal coupled to receive the first data value, and a second compare transistor having a controllable current path in series with the first compare transistor and a gate coupled to receive the compare data value, and
   a second charge transfer path electrically in parallel with the first charge transfer path and comprising a third compare transistor having a control terminal coupled to receive the second data value, and a fourth compare transistor having a controllable current path in series with the third transistor and a gate coupled to receive the complementary compare data value.

4. The TCAM cell circuit of claim 1, wherein:
   the first, second, third and fourth data paths each consist of one insulated gate field effect transistor.

5. A ternary content addressable memory (TCAM) cell circuit formed in a TCAM memory cell array having cells arranged in rows and columns, comprising:
   a first storage circuit that stores a first data value and has a first data path coupled to a first storage node and a second data path coupled to a second storage node;
   a second storage circuit that stores a second data value and has a third data path coupled to a third storage node and a fourth data path coupled to a fourth storage node;
   a compare circuit that generates a match result at a match node based on the first data value, second data value, and a compare data value; and
   no more than five conductive lines disposed in the column wise direction having a direct electrical connection to the TCAM cell for providing non-power supply signals, including a first bit line coupled to the first data path, a second bit line coupled to the third data path, and a third bit line coupled to the second and fourth data paths, wherein
   the no more than five conductive lines consists of three conductive lines, the first bit line being further coupled to the compare circuit, and the second bit line being further coupled to the compare circuit.

6. The TCAM cell circuit of claim 5, wherein:
   the first data path and third data path are commonly coupled to a first word line; and
   the second data path and fourth data path are commonly coupled to a second word line.

* * * * *